(12) United States Patent
Lee et al.

(10) Patent No.: US 6,379,491 B1
(45) Date of Patent: Apr. 30, 2002

(54) PLASMA CHAMBER WITH EROSION RESISTIVE SECUREMENT SCREWS

(75) Inventors: Ray C. Lee, Taipei; Te-Hsun Pang, Chia-Yi; Tonny Shu, Mao-Li Hsien; Birdson Lee, Kao-Hsiung, all of (TW)

(73) Assignees: ProMOS Technologies, Inc.; Mosel Vitelic, Inc., both of Taiwan (TW); Siemens AG, Munich (DE)

( * ) Notice: Subject to any disclaimer, the term of this patent is extended or adjusted under 35 U.S.C. 154(b) by 0 days.

(21) Appl. No.: 09/183,015

(22) Filed: Oct. 30, 1998

(51) Int. Cl.[7] .............................................. E23C 16/00
(52) U.S. Cl. ................ 156/345; 118/723 R; 118/723 E
(58) Field of Search ...................... 156/345; 118/723 R, 118/723 E

(56) References Cited

U.S. PATENT DOCUMENTS 5,593,541 A * 1/1997 Wong ....................... 156/643.1
5,942,074 A * 8/1999 Lenz .......................... 156/345
5,983,906 A * 11/1999 Zhao .......................... 156/345

OTHER PUBLICATIONS

Merriam–Webster's Collegiate Dictionary 10th Ed., pp. 238 and 254, 1998.*

* cited by examiner

*Primary Examiner*—Richard Bueker
(74) *Attorney, Agent, or Firm*—Proskauer Rose LLP

(57) ABSTRACT

An apparatus is provided for treating a wafer under fabrication with an erosive plasma, in a contamination controlled environment. The apparatus includes a chamber for containing the wafer to be treated by the plasma, and for isolating the wafer from contaminants external to the chamber during treatment. The chamber also includes one or more plasma erosion resistive screws. Each screw has a shaft secured within the chamber so that the shaft is unexposed to the plasma, and a raised head which is integral with, and made of the same material as, the shaft. The head has a continuous, surface shape with a reduced number of edges so as to reduce the accumulation of charge thereon, thereby resisting erosion by the plasma.

7 Claims, 2 Drawing Sheets

PLASMA CHAMBER WITH EROSION RESISTIVE SECUREMENT SCREWS

RELATED APPLICATION

The following patent application contains subject matter which is related to the subject matter of this application:

U.S. patent application Ser. No. 09/183,014, entitled "Plasma Chamber Wafer Clamping Ring With Erosion Resistive Tips," filed for Ray C. Lee, Mu-Tsun Ting, Jen-Hui Hsiao and Troy Chen on even date herewith, now U.S. Pat. No. 6,166,898.

The above-listed patent application is commonly owned by the assignees of this application and the contents of the above-listed patent application are incorporated herein by reference.

FIELD OF THE INVENTION

The present application pertains to plasma treatment chambers such as those used in semiconductor integrated circuit fabrication.

BACKGROUND OF THE INVENTION

FIG. 1 shows a plasma chamber which may, for example, be used in the fabrication of semiconductor integrated circuits. As shown, a wafer W (e.g., on which one or more semiconductor integrated circuits are formed) is positioned between first and second electrodes e1 and e2 located at opposite sides of the chamber. The wafer W is also located between north m1 and south m2 poles of a magnet also on opposite sides of the chamber, which sides are orthogonal to the sides at which the electrodes e1 and e2 are located. A low pressure gas G is introduced into the plasma chamber through an inlet port, such as a shower head S. A voltage source V applies an oscillating voltage (of, for example, 13.58 MHz) across the electrodes e1 and e2 to produce an electric field E directed between the two electrodes e1 and e2. This tends to cause the molecules of the low pressure gas G to gyrate in a cycloid motion. The north and south poles m1 and m2 of the magnet introduce a magnetic field B directed between the two poles, which magnetic field B is orthogonal to the electric field E. This tends to increase the collisions of the gyrating molecules thereby completely ionizing them to form the plasma P over the wafer W. A coolant C, such as liquid He, may be circulated on the underside of the wafer W to cool it during treatment.

FIG. 2 shows a more detailed view of certain parts of an actual plasma chamber 100, such as the MXP Centura™, distributed by Applied Materials, Inc.™, located in Santa Clara, Calif. The chamber 100 has cylindrically shaped sidewalls 105. A cathode 110 is located at the bottom of the chamber 100. A pedestal 120 is secured to the cathode 110. (Actually, additional parts may be secured to the cathode 110 between the cathode 110 and the pedestal 120, such as an O-ring and aluminum sheet interface. These are omitted for sake of brevity.) The pedestal 120 is secured by screwing screws through the holes 122 of the pedestal 120 and the holes 112 of the cathode 110. A quartz pedestal liner ring, not shown, may then be placed in the chamber 100 surrounding the pedestal 120 (for purposes of improving the uniformity of the flow of the plasma gas over the entire wafer W). A transparent quartz cover or focus ring 150 may then be secured to the top of the chamber 100 to form a gas-tight seal, thereby confining the plasma P within the chamber 100 and isolating the wafer W from external contamination. As shown, the quartz cover or focus ring 150 is secured by screwing screws 130 through holes 132 to the chamber 100 or another part secured therein (not shown for sake of brevity). A quartz cap 140 may be placed on top of each screw 130.

The wafer W may be secured to the pedestal 120 in one of two ways. The pedestal 120 can be an electrostatic chucking pedestal. Such a pedestal 120 can generate an electrostatic charge that holds the wafer W in place during treatment Alternatively, an ordinary pedestal 120 may be used. In such a case, the wafer W is then clamped to the pedestal 120 using a clamping ring 160. As shown, the clamping ring 160 has plural tips 170 which extend radially towards the interior of the ring 160. The dimensions of the clamping ring 160 are such that the ring 165 thereof has a greater diameter than the wafer W and does not touch the wafer. Rather, only the tips 170 contact and touch the wafer W. The tips 170 have holes 172 to enable screwing the clamping ring 160 to the pedestal 120 using (e.g., metal) screws 131 (which in turn are covered by graphite plugs, not shown) so that the tips 170 contact and press down on the wafer W, thereby holding it in place.

Plasma treatment is commonly used to etch structures on the wafer, such as polycrystalline silicon (poly) and oxide structures. Specifically, wafer structures not to be etched are typically covered with a mask whereas wafer structures to be etched are left exposed. The treatment using the plasma erodes the exposed structures.

Such a plasma erosive effect is also incurred by the various parts within the chamber 100. This reduces the life time of the parts. Moreover, because such pats are eroded while treating the wafer, the eroded material of the parts is introduced in the plasma chamber 100 as a contaminant. This tends to reduce the yield of the semiconductor integrated circuits formed from the treated wafers. Two parts specifically subject to the plasma erosive effect are the screws 130, used to secure the quartz focus ring or cover 150 (and, theoretically, can be used to secure other objects within the plasma chamber 100), and the clamping rings 160.

FIG. 3 shows the screw 130 and cap 140 assembly in greater detail. The screw 130 includes a threaded shaft 135 and a head 137 affixed to, and integral with, the top of the screw 130. The screw 130 is preferably made of a polyimide material, such as the material marketed under the brand name Vespel™ by DuPont Engineering Polymers,™ located in Newark, Del. The screw head 137 has a concave shape. Specifically, the screw head 137 has a recess or slot 139 formed therein for receiving a screw driver blade. As such, the screw head 137 has sharp "pointed" edges 131 and 133, which edges 131 and 133 each have a small surface area.

The screw 130, in particular, the screw head 137, is subject to erosion by the plasma. (The shaft 135 is typically completely screwed into another object within the chamber 100 such as the hole 132. Thus, only the screw head 137 is exposed to the plasma of the chamber 100.) In an effort to extend the lifetime of the screw 130, a protective quartz cap 140 is typically placed over the screw. The quartz cap 140 has an opening 141 which is dimensioned larger than the screw head 137 so that it can be placed over, and can cover, the screw head 137.

There are several problems with the screw 130 and quartz cap 140 assembly. First, it is difficult to make a cap 140 that fits tightly on the screw 130. This has two consequences. Specifically, some plasma is able to reach the screw 130 and erode it. The eroded material produces a build up of contaminating particles within the opening 140. This contaminates the wafer. In addition, the useful life of the screw 130 is limited to only about 100 hours before it is too badly eroded to be reused.

Second, during use, the vibration of the chamber 100 can dislodge the caps 140 causing one or more to be damaged or lost under (or within) one of the many removable parts of the machine (only some of which are shown in FIG. 1). As the quartz caps 140 are quite expensive (e.g., around U.S. $40 each), this substantially increases the cost of semiconductor integrated circuit manufacture.

In addition, the chamber 100 is utilized in an application in which contamination is controlled. The operator of the chamber must therefore wear protective gloves while inserting and screwing in the screws 130. As this requires both placement of the screw in a hole and use of a screw driver, the operation requires a large amount of time, thereby reducing the amount of time that the chamber 100 can be utilized in the fabrication process.

It is an object of the present invention to overcome the disadvantages of the prior art.

SUMMARY OF THE INVENTION

This and other objects are achieved by the present invention. According to one embodiment, an apparatus is provided for treating a wafer under fabrication with an erosive plasma, in a contamination controlled environment. The apparatus includes a chamber for containing the wafer to be treated by the plasma, and for isolating the wafer from contaminants external to the chamber during treatment. The chamber also includes one or more plasma erosion resistive screws. Each screw has a shaft secured within the chamber so that the shaft is unexposed to the plasma, and a raised head which is integral with, and made of the same material as, the shaft. The head has a continuous, surface shape with a reduced number of edges so as to reduce the accumulation of charge thereon, thereby resisting erosion by the plasma.

DETAILED DESCRIPTION OF THE INVENTION

Figure 1:
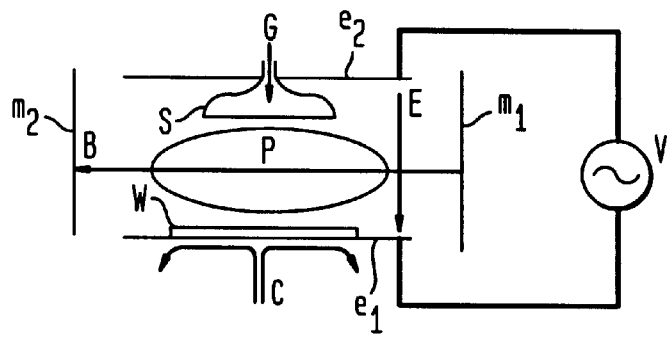
FIG. 1 shows a schematic of a conventional plasma chamber.
Figure 3:
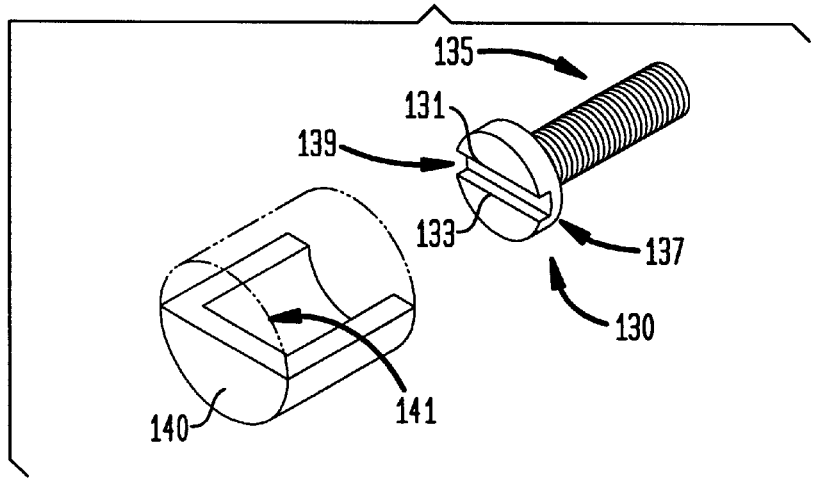
FIG. 3 shows a conventional screw and cap assembly.

This invention is based on the discovery that the screw slot edges (e.g., slot 139 edges 131 and 133) are most subject to attack by the plasma erosion. Specifically, it is known that the magnetic field B induces a net drift in the plasma P, which is constituted by charged ions. As a result, a net positive charge accumulates at one of the magnetic poles and a net negative charge accumulates at the other magnetic pole. This can induce a charge on any object in the chamber 100 such as the wafer W or the screws 130. As is well known negative charge tends to concentrate at a point of an object having a low volume and a small surface area, such as the edges of the screw slots. The highly concentrated accumulated charge at the screw slot edges dramatically increases the plasma erosion thereat. As such, it is desirable to remove such edges from the screw 130.

Figure 4:
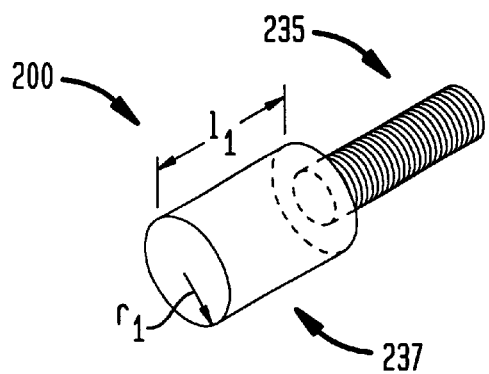
FIG. 4 shows a screw according to the invention.

FIG. 4 shows a screw 200 according to the present invention. The screw is in the form of a "thumb" machine screw, although other screw embodiments are possible. The screw 200 has a threaded shaft 235 attached to, and integral with, a raised head 237. Illustratively, both the shaft 235 and head 237 are made integrally from the same plasma erosion resistive material, such as a polyimide material.

Illustratively, the head 237 of the screw 200 has a length of about 11≈8 mm, although the length is preferably 5 mm or more. The screw head 237 illustratively is a continuous concave surface of rotation, or as shown in FIG. 4, a continuous convex surface of rotation, in this case, a cylinder, although other surface of rotation shapes are possible such as dome shapes. The radius of the screw 200 is about r1≈5 mm, although any radius of 1–50 mm can be used.

The radius r1 and length 11 of the screw 200 are selected so that the screw head 237 can be manipulated by hand. Specifically, since the slot has been eliminated, the screw 200 is preferably manually screwed into the receiving hole (e.g., the hole 132, 152 or 112). This is advantageous. While the operator must insert the screws 200 by hand, it is easier to do so manually than with a screw driver. Moreover, the increased height 11 of the screw 200 enables the screw 200 to incur a large amount of erosion before it is no longer usable. These improvements have increased the lifetime of the screws 200 to about 300 hours before failure.

Figure 2:
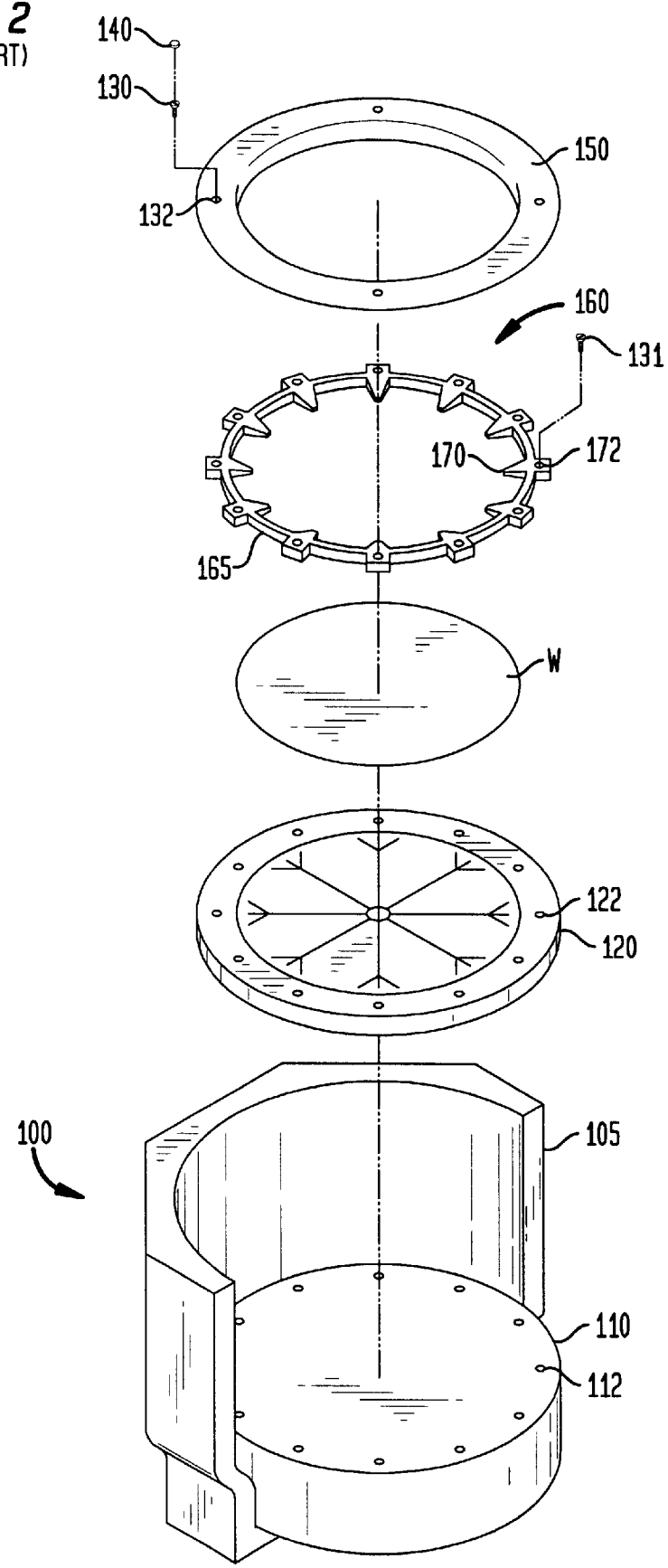
FIG. 2 shows an exploded view of a conventional plasma chamber.

The screws 200 can be used in the chamber 100 (FIG. 2) to screw down virtually any object therein or thereto such as the pedestal 120, quartz focus ring or cover 150, the clamping ring 160, etc. As before, the operator inserts the threaded shaft 235 in the hole 112, 132, 152 or 172. The operator then simply twists the head 237 of the screw manually until the screw is tightened, e.g., with the shaft 235 shielded from exposure to the plasma within the chamber 100. Preferably, the operator wears gloves during this operation to avoid contaminating the chamber 100.

The above discussion is merely illustrative of the invention. Those skilled in the art may devise numerous alternative embodiments without departing from the spirit and scope of tile following claims.

The claimed invention is:

1. An apparatus for treating a wafer under fabrication with an erosive plasma, in a contamination controlled environment, comprising:
    a chamber for containing the wafer to be treated by the plasma, and for isolating the wafer from contaminants external to the chamber during treatment, and
    one or more plasma erosion resistive screws, each having a shaft secured within the chamber so as to limit exposure of the shaft to the plasma, and a raised head which is integral with, and made of the same material as, the shaft, at least part of the raised head protruding into the chamber so as be exposed to the plasma to a greater extent than the shaft, the head of the screw having a continuous, uninterrupted outer-surface shape which is an uninterrupted, surface of rotation.

2. The apparatus of claim 1 wherein the head protrudes at least 5 mm above the shaft so as to facilitate manual screwing of the screw.

3. The apparatus of claim 2 wherein the plasma erosion resistive screw is made of a material that resists erosion by the plasma.

4. The apparatus of claim 3 wherein the material is a polyimide.

5. The apparatus of claim 1 further comprising:
    an inlet in the chamber for introducing a low pressure gas into the chamber to be ionized into the plasma,
    a pair of electrodes on first and second opposite sides of the chamber, for generating an electric field in a first direction, a magnet with north and south poles on third and fourth opposite sides of the chamber, the third and fourth sides being orthogonal to the first direction, and an object comprising a hole formed therein through which the shaft of the screw is inserted so as to secure the object to the chamber with the shaft being at least partially shielded from the plasma created in the chamber.

6. An apparatus for treating a wafer an erosive agent, in a contamination controlled environment, comprising:

a chamber for containing the wafer to be treated by the erosive agent, and for isolating the wafer from contaminants external to the chamber during treatment, and one or more screws which resist erosion by the erosive agent, each having a shaft secured within the chamber so as to limit exposure of the shaft to the erosive agent, and a raised head which is integral with, and made of the same material as, the shaft, at least part of the raised head protruding into the chamber so as be exposed to the erosive agent to a greater extent than the shaft, the head of the screw having a continuous, uninterrupted outer-surface shape which is an uninterrupted, surface of rotation.

7. The apparatus of claim 6 wherein an electric field is applied to the head of the screw while exposed to the erosive agent and wherein the outer-surface shape of the screw reduces the concentration of charge at individual portions thereof while exposed to the erosive agent, so as to resist erosion by the erosive agent.

* * * * *